(12) United States Patent
Matsunaga et al.

(10) Patent No.: US 11,508,544 B2
(45) Date of Patent: Nov. 22, 2022

(54) THERMOELECTRIC FIELD EMISSION ELECTRON SOURCE AND ELECTRON BEAM APPLICATION DEVICE

(71) Applicant: Hitachi High-Tech Corporation, Tokyo (JP)

(72) Inventors: Soichiro Matsunaga, Tokyo (JP); Souichi Katagiri, Tokyo (JP); Keigo Kasuya, Tokyo (JP); Aki Takei, Tokyo (JP); Hajime Kawano, Tokyo (JP); Takashi Doi, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/278,848

(22) PCT Filed: Sep. 25, 2018

(86) PCT No.: PCT/JP2018/035308
§ 371 (c)(1),
(2) Date: Mar. 23, 2021

(87) PCT Pub. No.: WO2020/065703
PCT Pub. Date: Apr. 2, 2020

(65) Prior Publication Data
US 2022/0037107 A1    Feb. 3, 2022

(51) Int. Cl.
*H01J 37/073* (2006.01)
*H01J 37/10* (2006.01)

(52) U.S. Cl.
CPC ............ *H01J 37/073* (2013.01); *H01J 37/10* (2013.01)

(58) Field of Classification Search
CPC .................................................. H01J 37/073
See application file for complete search history.

(56) References Cited

U.S. PATENT DOCUMENTS 8,040,034 B2    10/2011 Nonogaki et al.
2014/0197725 A1*  7/2014 Katagiri ................ H01J 1/16
                                                     313/37

FOREIGN PATENT DOCUMENTS

JP         S62126600 A     6/1987
JP         H11354007 A    12/1999
(Continued)

OTHER PUBLICATIONS

Search Report dated Nov. 20, 2018 in corresponding International Application No. PCT/JP2018/035308.
(Continued)

*Primary Examiner* — Joseph L Williams
(74) *Attorney, Agent, or Firm* — Miles & Stockbridge, P.C.

(57) ABSTRACT

To stabilize an emitted electron beam, a thermoelectric field emission electron source includes: an electron source having a needle shape; a metal wire to which the electron source is fixed and configured to heat the electron source; a stem fixed to an insulator and configured to energize the metal wire; a first electrode having a first opening portion and arranged such that a tip of the electron source protrudes from the first opening portion; a second electrode having a second opening portion; and an insulating body configured to position the first electrode and the second electrode such that a central axis of the first opening portion and a central axis of the second opening portion coincide with each other, and to provide electrical insulation between the first and second electrodes, so as to provide a structure that reduces an amount of gas released when the first electrode is heated.

21 Claims, 11 Drawing Sheets

(56) References Cited

FOREIGN PATENT DOCUMENTS

JP         2003100244 A     4/2003
JP         2008140623 A     6/2008

OTHER PUBLICATIONS

Written Opinion dated Nov. 20, 2018 in corresponding International Application No. PCT/JP2018/035308.
Genichi Horikoshi "Vacuum Technique", University of Tokyo Press, 1994, 3rd Edition, pp. 156-162.
Office Action dated Jul. 17, 2020 in corresponding Taiwan Application No. 108131675.

\* cited by examiner

[FIG. 1]
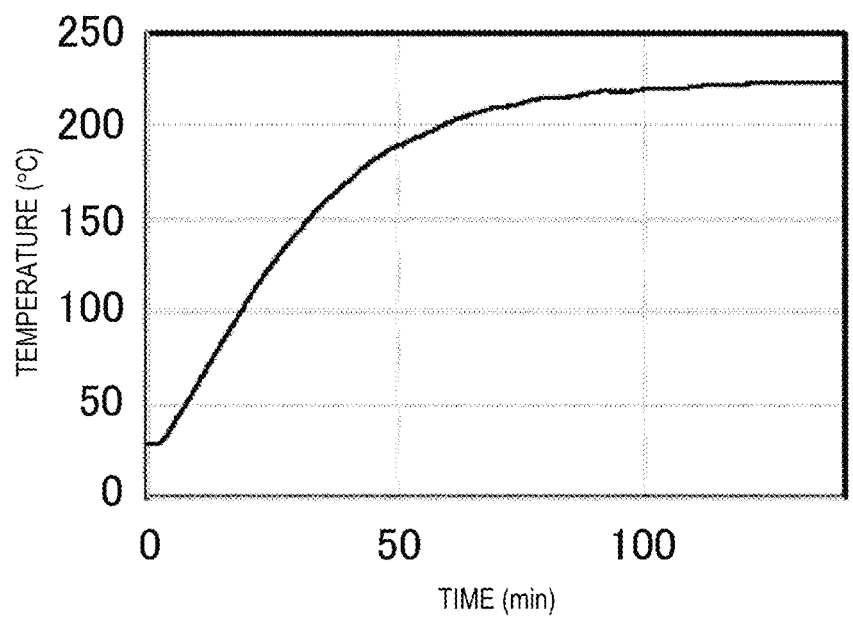

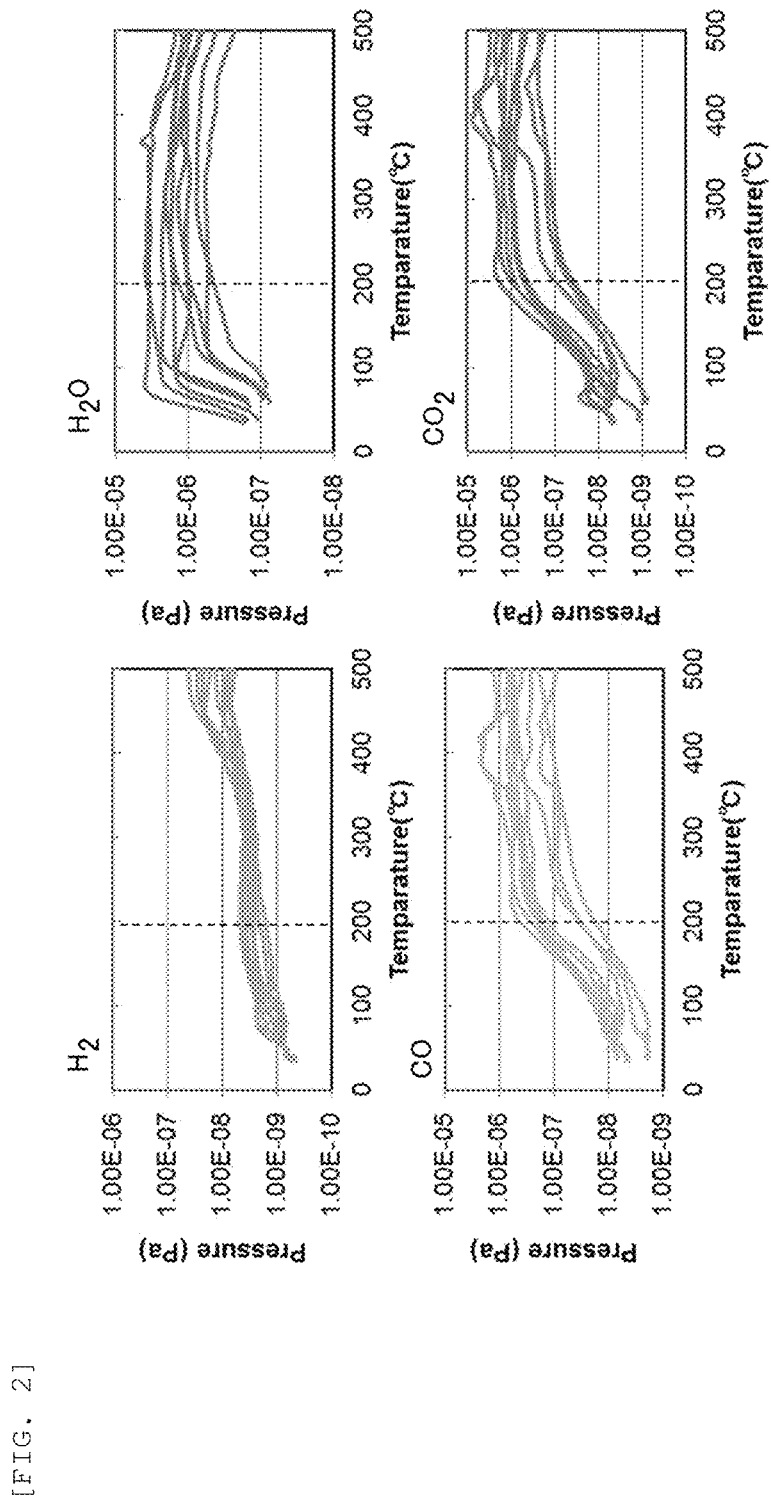
[FIG. 2]

[FIG. 3]
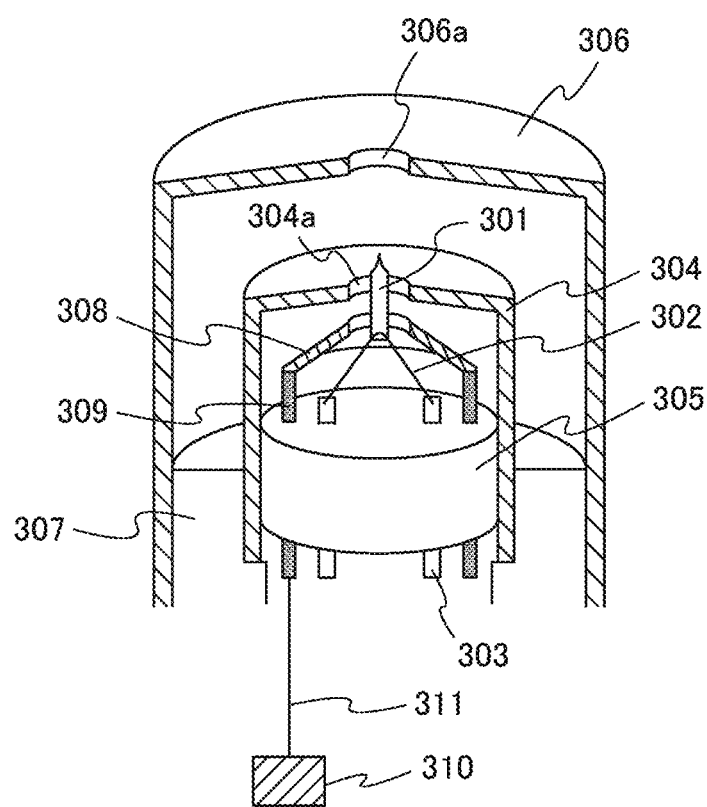

[FIG. 4]
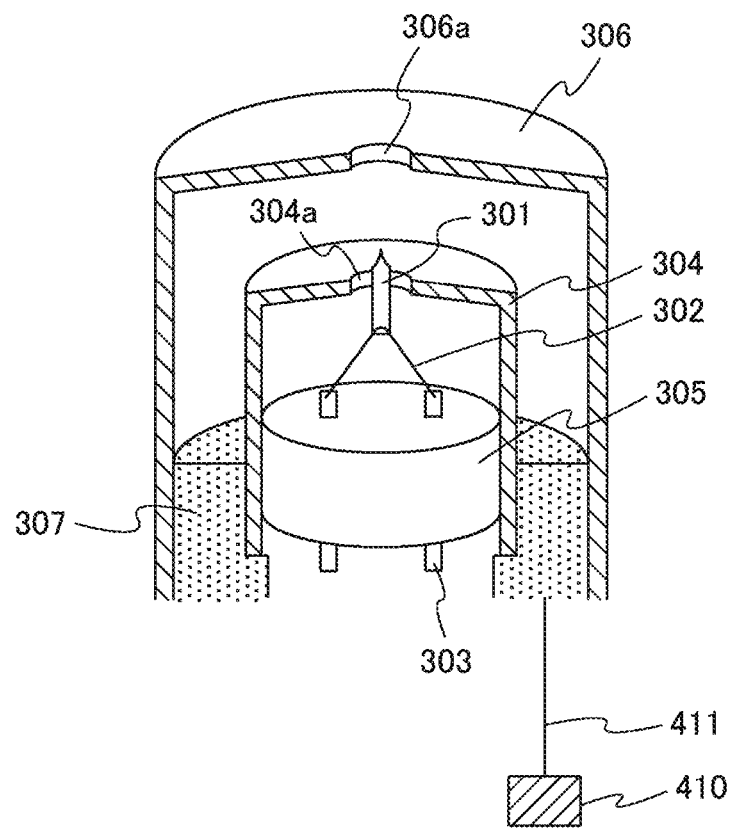

[FIG. 5]
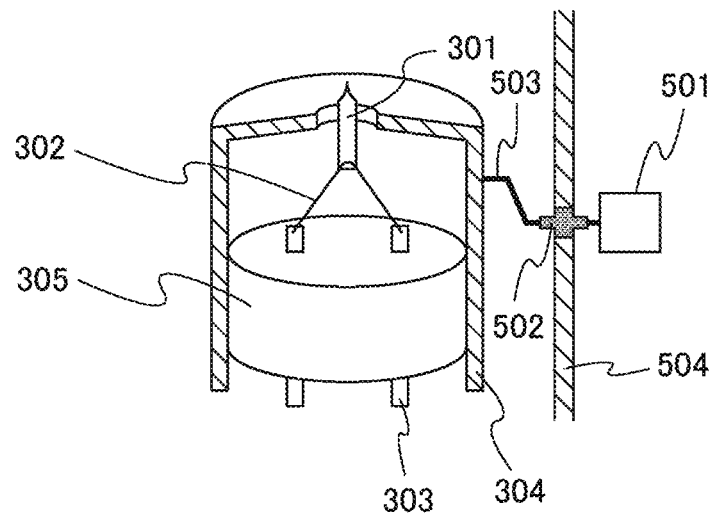
[FIG. 6]
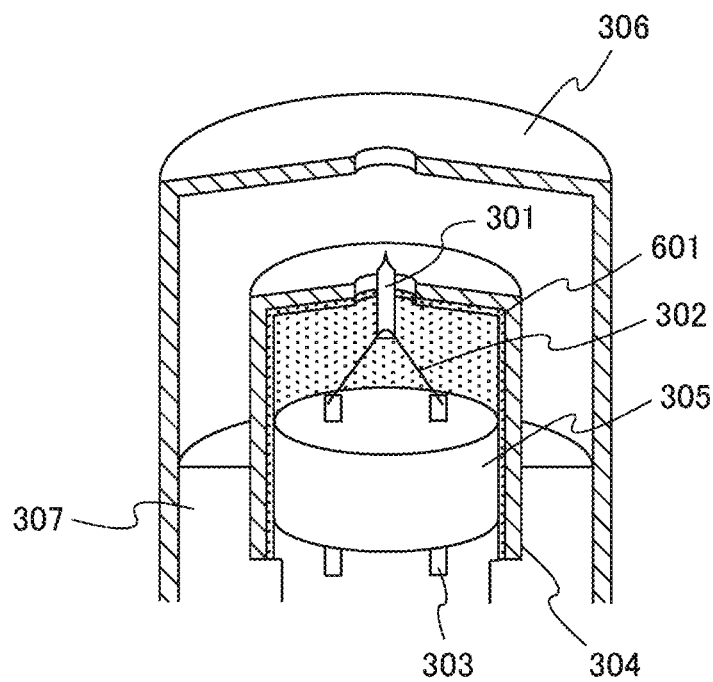

[FIG. 7]
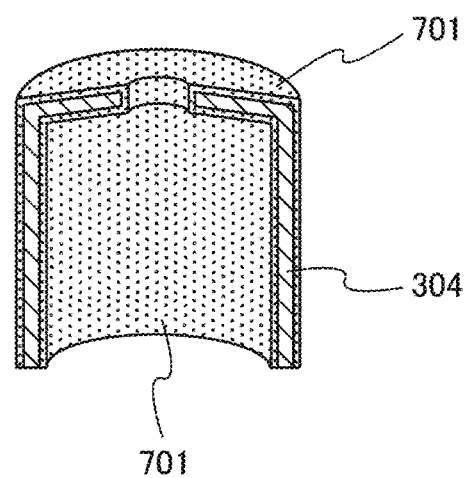

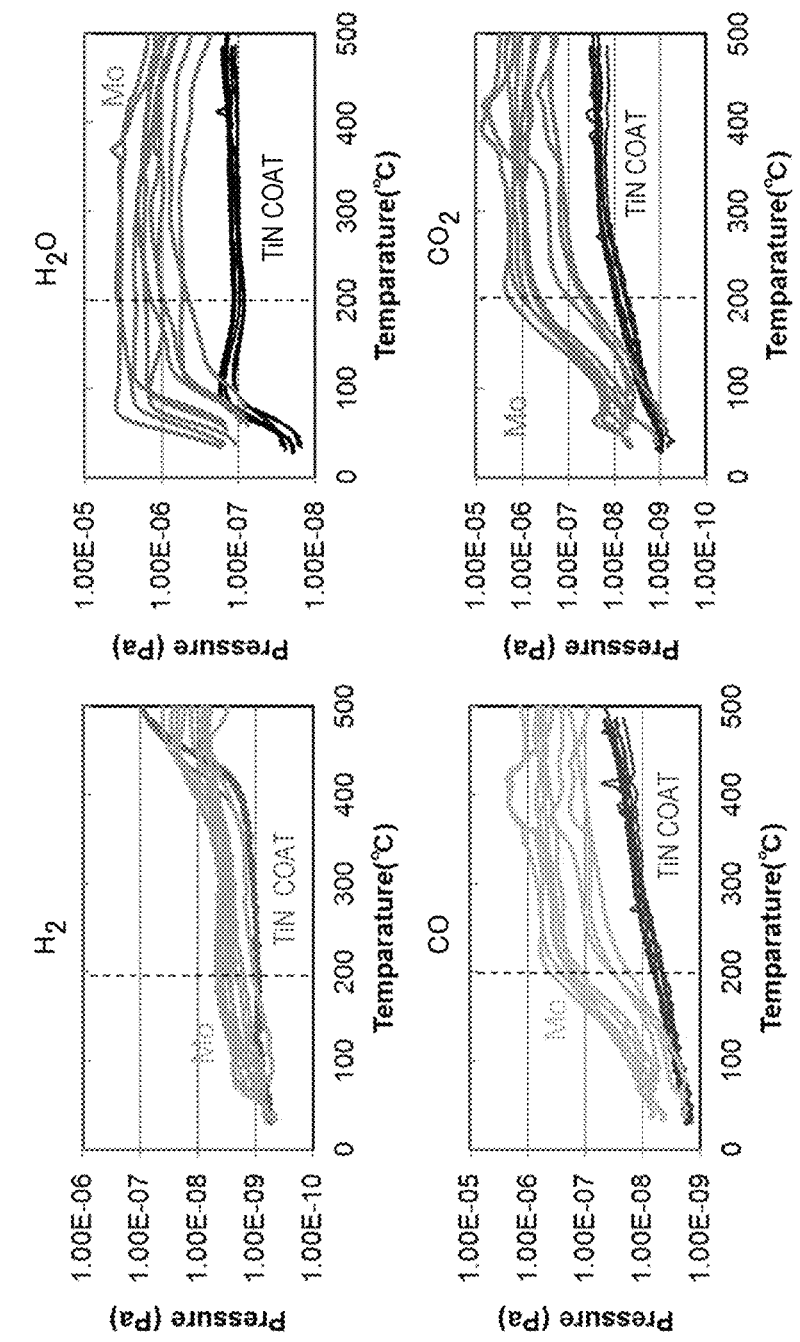
[FIG. 8]

[FIG. 9]
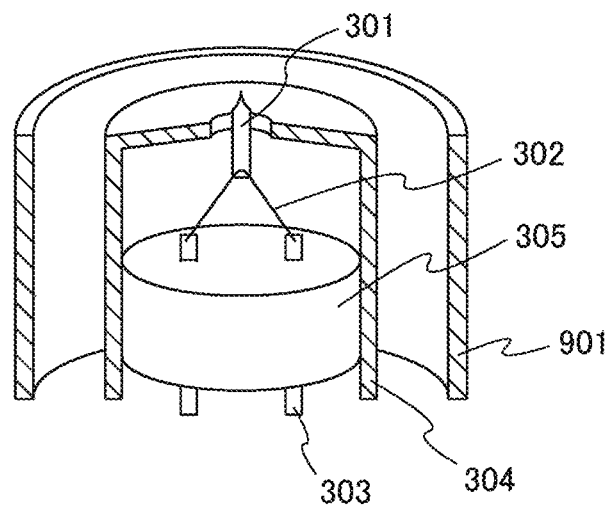
[FIG. 10]
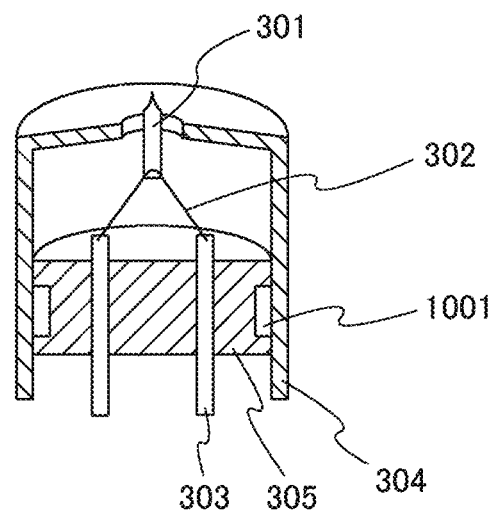

[FIG. 11]
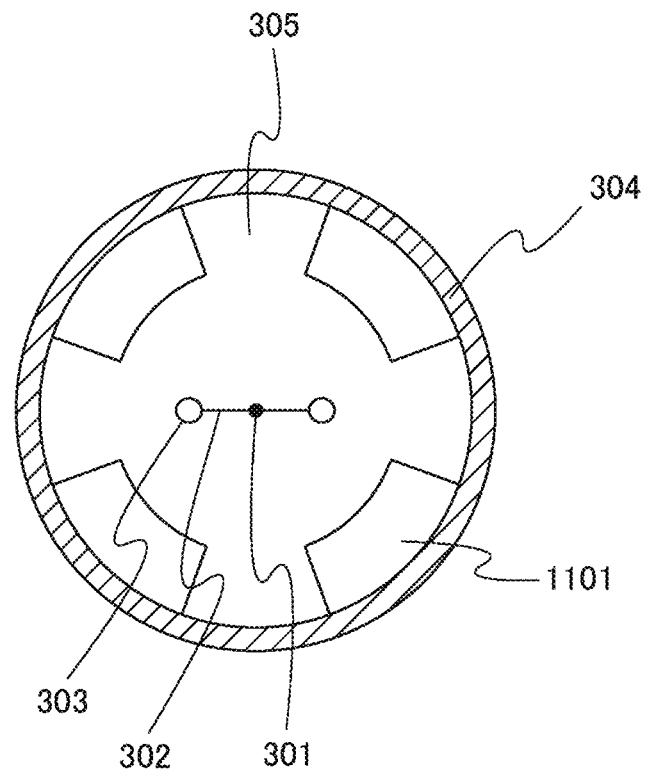
[FIG. 12]
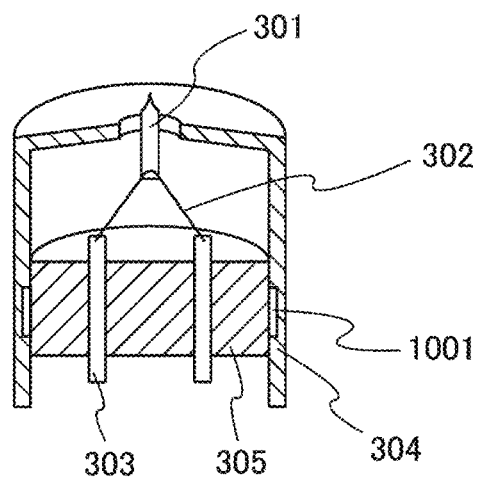

[FIG. 13]
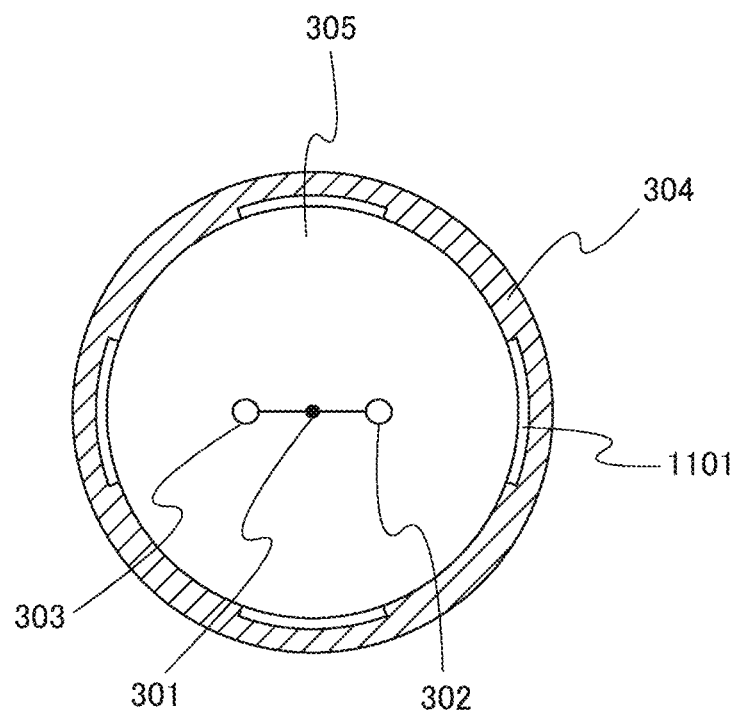

[FIG. 14]
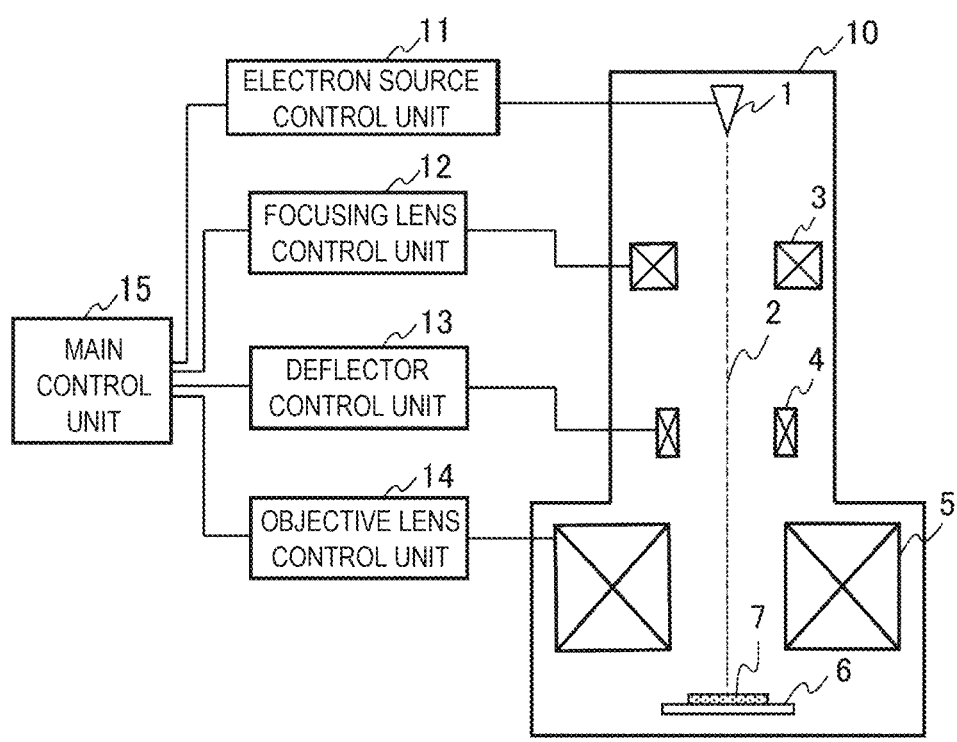

THERMOELECTRIC FIELD EMISSION ELECTRON SOURCE AND ELECTRON BEAM APPLICATION DEVICE

TECHNICAL FIELD

The present invention relates to an electron source used in an electron beam application device such as an electron microscope, or an electron beam application device equipped with an electron source.

BACKGROUND ART

A scanning electron microscope (SEM) is widely used for visualization of fine structures. The SEM is used not only for observation of a morphology of a material such as a metal and observation of a fine shape and morphology of a biological sample, but also for dimensional inspection and defect inspection of a semiconductor fine pattern. In SEM, a scanning image (SEM image) is obtained by scanning while irradiating a measurement sample with an electron beam and detecting signal electrons (secondary electrons or backscattered electrons) emitted from the measurement sample.

An important point in obtaining the SEM image is to keep the electron beam emitted from the electron source constant. This is because when an amount of emitted electrons decreases, a current with which the sample is irradiated also decreases, and a brightness of an obtained SEM image decreases. The decrease in the brightness of the SEM image means that an amount of the signal electrons decreases, and a decrease in a signal noise ratio not only decreases the brightness but also increases a roughness of the image. When the roughness increases, visibility of the SEM image decreases. In addition, when an inspection is performed using the obtained SEM image, there is a risk of causing a problem that inspection accuracy is lowered.

In order to keep an amount of current emitted from the electron source stable, a vacuum degree has been improved. As a method for obtaining an electron beam, there are a method in which an electron emission source is heated to obtain a thermionic electron, and a method in which a high voltage is applied to an electron emission source to obtain a field emission electron. In both cases, the electron source is installed in a vacuum. Regarding a thermionic electron source, a residual gas in the vacuum reacts with the heated electron source to change a surface structure thereof, thereby changing an amount of emitted current. Meanwhile, regarding a field emission electron source, the ease of electron emission (work function) from a surface changes due to a residual gas molecule in the vacuum adsorbed on the surface, thereby changing an amount of emitted current.

In order to improve the vacuum degree, a method for reducing a gas released from a surface in contact with the vacuum is well known. For example, PTL 1 discloses that a vacuum chamber side surface having a wide area in contact with a vacuum is coated with a material having a small gas release. In addition, PTL 2 discloses that an extraction electrode or an acceleration electrode to be irradiated with an electron beam is coated with a material having a small gas release in order to reduce a gas generated by electron irradiation. In addition, as disclosed in NPL 1 and PLT 3, a method called baking, in which degassing is promoted by raising a temperature of components constituting an electron gun so as to increase a vacuum degree at room temperature cooling, is generally performed. In order to perform the baking, generally, a heat-resistant metal and a ceramic are often used for components that constitute an ultra-high vacuum.

CITATION LIST

Patent Literature

PTL 1: JP-A-S62-126600
PTL 2: JP-A-2003-100244
PTL 3: JP-A-2008-140623

Non-Patent Literature

NPL 1: Genichi Horikoshi, "Vacuum Technique", 3rd Edition, University of Tokyo Press, 1994, p. 156-162

SUMMARY OF INVENTION

Technical Problem

A thermoelectric field emission electron source uses a sharpened refractory metal wire as an electron source main body, and is provided with a filament for heating the electron source, an extraction electrode for drawing electrons, an acceleration electrode for accelerating electrons to a desired acceleration, and further, an electrode (suppressor electrode) upstream of the electron source so that thermionic electrons emitted from the heated filament do not mix with a sample irradiation current. Since a function of the suppressor electrode is to push back thermionic electrons from the filament, it is characteristic that the suppressor electrode is provided so as to surround the electron source and the filament, and a negative potential is further applied to the electron source and the filament. In the related art, it is considered that a surface area of the suppressor electrode is sufficiently small with respect to an inner wall of the chamber, and a gas release amount is small, and unlike the extraction electrode and the acceleration electrode, electrons are not emitted due to a negative potential with respect to the electron source. Therefore, it is considered that there is almost no degassing amount due to electron beam irradiation. Therefore, the suppressor electrode is not noticed as a cause of deteriorating the vacuum.

However, the inventors have also found that degassing from the suppressor electrode is also noteworthy. This is because it is newly found that strong light is emitted from the electron source and the filament heated to a high temperature to emit electrons, and the suppressor electrode is strongly heated by a radiant heat. FIG. 1 shows a relation between an operation time of the electron source and the temperature of the suppressor electrode. It can be seen that the suppressor electrode is heated by the operation of the electron source and is heated to about 200° C. In addition, FIG. 2 shows results of analysis of types and release amounts of gas generated when the suppressor electrode is heated. In the diagram, $H_2$, $H_2O$, $CO$, and $CO_2$ are shown as typical gas types. A plurality of waveforms is shown for each gas type, which indicates a variation in the gas release amount. It was found that when the suppressor electrode is heated to about 200° C., 100 times as much gas as that generated at room temperature is generated depending on the gas type. From this, degassing from the suppressor electrode is newly recognized as the cause of destabilizing the amount of current emitted from the electron source.

Solution to Problem

A thermoelectric field emission electron source includes: an electron source having a needle shape; a metal wire to which the electron source is fixed and configured to heat the electron source; a stem fixed to an insulator and configured to energize the metal wire; a first electrode having a first opening portion and arranged such that a tip of the electron source protrudes from the first opening portion; a second electrode having a second opening portion; and an insulating body configured to position the first electrode and the second electrode such that a central axis of the first opening portion and a central axis of the second opening portion coincide with each other, and provide electrical insulation between the first electrode and the second electrode, so as to provide a structure in which an amount of gas released when the first electrode is heated is reduced.

In addition, there is provided an electron beam application device using the thermoelectric field emission electron source having such a structure.

Advantageous Effect

An amount of an electron beam emitted from a thermoelectric field emission electron source can be stabilized.

Other problems and novel features will be apparent from description of the present description and accompanying drawings.

BRIEF DESCRIPTION OF DRAWINGS

FIG. 1 is a diagram showing a relation between an operation time of an electron source and a temperature of a suppressor electrode.

FIG. 2 is a diagram showing types and amounts of gas released from a suppressor electrode.

FIG. 3 is a schematic diagram of a thermoelectric field emission electron source according to a first embodiment.

FIG. 4 is a schematic diagram of a thermoelectric field emission electron source according to a second embodiment.

FIG. 5 is a schematic diagram showing a cooling structure and a voltage application structure of a suppressor electrode in a third embodiment.

FIG. 6 is a schematic diagram of a thermoelectric field emission electron source according to a fourth embodiment.

FIG. 7 is a diagram showing a suppressor electrode in a fifth embodiment.

FIG. 8 is a diagram showing an effect of reducing an amount of gas released in a fifth embodiment.

FIG. 9 is a diagram showing a structure for heating a suppressor electrode in a sixth embodiment.

FIG. 10 is a diagram showing a structure for reducing heat conduction to a suppressor electrode.

FIG. 11 is a diagram showing a structure for reducing heat conduction to a suppressor electrode.

FIG. 12 is a diagram showing a structure for reducing heat conduction to a suppressor electrode.

FIG. 13 is a diagram showing a structure for reducing heat conduction to a suppressor electrode.

FIG. 14 is a schematic configuration diagram of an electron beam application device.

DESCRIPTION OF EMBODIMENTS

Embodiments of the invention will be described below with reference to the drawings.

First Embodiment

FIG. 3 illustrates a schematic diagram of a thermoelectric field emission electron source according to the first embodiment. Two parts near both end portions of a filament (metal wire) 302 are spot-welded to two stems 303 fixed to an insulator 305. An electron source 301 is spot-welded to a central portion of the curved filament 302. The electron source 301 is, for example, a single crystal tungsten rod, in which one end has a shape of a sharply pointed needle, and the other end is welded to the filament 302. The filament 302 is, for example, tungsten, which is energized via the stem 303 to heat the electron source 301. The insulator 305, the stem 303, the filament 302, and the electron source 301 are covered with a suppressor electrode 304. The suppressor electrode 304 has a reverse cup-shaped structure, and has a circular opening portion 304a in a central portion of a cup bottom. The electron source 301 is arranged such that a tip portion thereof protrudes from the opening portion 304a. Furthermore, an extraction electrode 306 is provided so as to cover the suppressor electrode 304. An insulating body 307 is arranged between the extraction electrode 306 and the suppressor electrode 304 to provide electrical insulation between the extraction electrode 306 and the suppressor electrode 304, and positioning is performed such that a central axis of an opening portion 306a of the extraction electrode 306 and a central axis of the opening portion 304a of the suppressor electrode 304 coincide with each other due to the insulating body 307. In addition, a positive potential is applied to the extraction electrode 306 with respect to the electron source 301 or the filament 302, and a negative potential is applied to the suppressor electrode 304 with respect to the electron source 301 or the filament 302.

In the first embodiment, a shielding member 308 for shielding light emitted from the filament 302 is provided between the filament 302 and the suppressor electrode 304. For example, the shielding member 308 is an umbrella-shaped plate having an opening portion provided so as to avoid the electron source 301 and cover the filament 302, and is supported by a supporting member 309. The supporting member 309 is fixed to the insulator 305. Due to the shielding member 308, a part of the light emitted from the filament 302 is blocked, and a temperature rise of the suppressor electrode 304 can be reduced to 100° C. or lower. As illustrated in FIG. 2, when the temperature of the suppressor electrode 304 is reduced to about 100° C., a large increase in the amount of gas released can be avoided. Meanwhile, since the shielding member 308 and the supporting member 309 rise in temperature due to radiation of the light emitted from the filament 302, there is a possibility that the shielding member 308 and the supporting member 309 become a gas generation source. Therefore, the shielding member 308 and the supporting member 309 are formed of a material having good thermal conductivity such as molybdenum (thermal conductivity 180 W/m·K), and an end of the supporting member 309 is in contact with a refrigerant 310 for cooling. Accordingly, the temperature of the shielding member 308 can be reduced to 100° C. or lower, and the amount of degassing from the shielding member 308 can be reduced. The refrigerant 310 is only required to be thermally connected to ultrahigh vacuum in which the electron source and the suppressor electrode are installed, and therefore, the refrigerant 310 is not necessarily arranged in a vacuum vessel constituting a mirror body of an electron beam application device. The refrigerant 310 such as a water bath or a Peltier element may be installed on an atmosphere side outside the vacuum vessel, and a heat transfer material 311 connected to the supporting member 309 may be drawn out of the vacuum vessel and connected to the refrigerant 310 to cool the supporting member 309. Alternatively, the atmosphere may be used as it is as the refrigerant.

In addition, since the potentials of the shielding member 308 and the supporting member 309 may be set to the potentials near the suppressor electrode 304 or the electron source 301, it is unnecessary to improve a withstand voltage of the insulator 305 as compared with a thermoelectric field emission electron source having a configuration of related art. In addition, similar to the suppressor electrode 304, a negative potential may be applied to the shielding member 308 or the supporting member 309 with respect to the electron source 301. In this case, the shielding member 308 or the supporting member 309 is not irradiated with electrons, and therefore, the shielding member 308 or the supporting member 309 may be made of an insulating body having good thermal conductivity, for example, silicon carbide (thermal conductivity 200 W/m·K) or aluminum nitride (thermal conductivity 150 W/m·K).

In addition, the shielding member 308 is only required to block the light emitted from the filament 302, and thus is not necessarily a plate shape, and may have a tube shape surrounding the filament 302. In addition, in the first embodiment, the suppressor electrode 304 is described as a typical electrode installed upstream of an electron emitting portion of the electron source 301, whereas an electrode other than the suppressor electrode can be applied to the invention as long as the electrode is installed upstream of the electron emitting portion of the electron source 301. The same applies to the second embodiment and subsequent embodiments and modifications.

Second Embodiment

In the first embodiment, the temperature rise of the suppressor electrode 304 is reduced by reducing an amount of heat inflow to the suppressor electrode 304, whereas in the second embodiment, the temperature rise of the suppressor electrode 304 is reduced by increasing an amount of heat outflow from the suppressor electrode 304.

FIG. 4 illustrates a schematic diagram of a thermoelectric field emission electron source according to the second embodiment. In order to reduce the temperature rise of the suppressor electrode 304, the insulating body 307 in contact with the suppressor electrode 304 is made of silicon carbide or aluminum nitride having better thermal conductivity than that of alumina (thermal conductivity 30 W/m·K) which is generally used in a thermoelectric field emission electron source having a configuration of related art, and an end of the insulating body 307 is in contact with a refrigerant 410 via a heat transfer material 411 to perform cooling, so that the temperature of the suppressor electrode 304 is reduced to 100° C. or lower and the degassing is prevented. Although these materials have a thermal expansion coefficient smaller than that of alumina, the temperature rise is prevented by cooling the insulating body 307, so that a thermoelectric field emission electron source that is less affected by thermal stress can be implemented. Furthermore, similar to the first embodiment, the refrigerant 410 may be installed on the atmosphere side outside the vacuum vessel, or the atmosphere may be used as it is as the refrigerant.

As a modification of the second embodiment, a metal having a thermal conductivity higher than that of alumina, for example, copper or aluminum may be used to form at least a part of the insulating body 307. Since the suppressor electrode 304 and the extraction electrode 306 are required to be electrically insulated, a part of the insulating body 307 that serves as a path from the suppressor electrode 304 to the refrigerant 410 is made of a material having a high thermal conductivity, and the other part is made of a material that serves an insulating body. The material that serves as the insulating body does not have to be a material having a high thermal conductivity, and may be, for example, alumina.

Third Embodiment

FIG. 5 illustrates a schematic diagram of a thermoelectric field emission electron source according to the third embodiment. In order to apply a voltage to the suppressor electrode 304, it is necessary to bring a power supply 501 installed outside the vacuum vessel, a feedthrough 502 provided on a wall 504 of the vacuum vessel to electrically conduct with the power supply 501, and a conductive component 503 into contact with each other. Stainless steel is often used for the feedthrough 502 and the conductive component 503 from the viewpoints of ease of machining, cost, and corrosion resistance, whereas the thermal conductivity of stainless steel is low (thermal conductivity 20 W/m·K), and thus these components are made of a material having a thermal conductivity higher than that of stainless steel, such as copper (thermal conductivity 380 W/m·K), aluminum (thermal conductivity 200 W/m·K), and molybdenum, so that these components are electrically connected with each other and thermally contacted with the atmosphere to release the heat of the suppressor electrode to the atmosphere. Furthermore, when the refrigerant such as the water bath or the Peltier element is arranged on the atmospheric side outside the vacuum vessel and is in contact with these conductive components, the temperature rise of the suppressor electrode can be more efficiently reduced.

Fourth Embodiment

In the first embodiment, the amount of heat inflow to the suppressor electrode 304 is reduced by shielding the radiation of the light emitted from the filament 302, whereas in the present embodiment, the amount of heat inflow to the suppressor electrode 304 is reduced by increasing a reflectance of the light emitted from the filament 302 in the suppressor electrode 304.

FIG. 6 illustrates a schematic diagram of a thermoelectric field emission electron source according to the fourth embodiment. An inner surface of the suppressor electrode 304, which faces the filament 302, is coated with a material 601 having a high reflectance. In general, the suppressor electrode 304 is made of molybdenum, and the reflectance of molybdenum is about 60%. Therefore, this inner surface is coated with silver or aluminum having a reflectance of 90% or more. Accordingly, the light absorption of the suppressor electrode 304 is decreased, and the temperature rise can be reduced.

In addition, the same effect can be obtained not only by coating a material having a high reflectance but also by performing a mechanical treatment such as mirror-polishing as long as the reflectance of the light from the filament 302 of the suppressor electrode 304 is improved. Furthermore, the mirror-polishing and the coating may be performed together.

In the present embodiment, since it is only necessary to perform the coating or the surface treatment, there is an advantage that an electron gun can be produced without changing a machining method, a material, or the like of an electrode component in a thermoelectric field emission electron source of related art.

Fifth Embodiment

In the first to fourth embodiments, the temperature rise of the suppressor electrode 304 is reduced to reduce the amount of gas released, whereas in the fifth embodiment, even if the temperature of the suppressor electrode 304 rises, the amount of gas released is reduced by making it difficult to generate gas.

FIG. 7 illustrates a suppressor electrode in a thermoelectric field emission electron source according to the fifth embodiment. A surface of the suppressor electrode 304 is coated with an inert metal 701. Examples of the inert metal 701 to be coded include gold and titanium nitride. By coating the surface of the suppressor electrode 304 with the inert metal 701, the amount of gas released can be reduced even though the temperature of the suppressor electrode 304 rises. FIG. 8 illustrates an example of measurement results of the temperature and the amount of gas generated when molybdenum, which is often used as a material for the suppressor electrode, is coated with titanium nitride. It can be seen that the amount of gas released at 200° C. is reduced to about 1/10 to 1/100. In addition, not only titanium nitride, other transition metal nitrides may also be used.

Sixth Embodiment

In the sixth embodiment, the amount of gas generated when the temperature rises is reduced in a form different from that of the fifth embodiment.

FIG. 9 illustrates a schematic diagram of a thermoelectric field emission electron source according to the sixth embodiment. A heater 901 is installed near the suppressor electrode 304. As described above, the electron gun is subjected to a baking processing to obtain the ultra-high vacuum. This baking process is performed to raise the ultimate vacuum degree in a short time. That is, by heating at the time of starting the vacuum to promote degassing, the amount of degassing at the time of room temperature cooling is reduced, and the ultimate vacuum degree is increased. In a normal baking process, the vacuum vessel is heated by using a heater installed outside the vacuum vessel in order to reduce degassing from the vacuum vessel having a large area. In the present embodiment, in addition to this baking process, the suppressor electrode 304 is efficiently heated by using the heater 901 installed in the vicinity of the suppressor electrode 304. As a result, gas generation from the suppressor electrode 304 can be promoted, and the amount of gas released during the electron operation can be reduced. In addition, since the temperature of the suppressor electrode 304 during the electron source operation is about 200° C., the temperature at which the suppressor electrode is heated by the heater 901 is set to at least 400° C. or higher in order to obtain an appropriate gas reduction effect.

Modifications for enhancing the effect of reducing the temperature rise of the suppressor electrode 304 described in the first to fourth embodiments will be described below. As illustrated in FIG. 3 and the like, the suppressor electrode 304 is in contact with the stem 303 for energizing the filament and the filament 302 for heating the electron source 301 via the insulator 305. Therefore, in addition to the thermal radiation described in the above embodiments, the suppressor electrode 304 is also warmed by the heat conduction through these objects. Heating by the heat conduction is weaker than heating by the heat radiation, whereas the influence of the heat radiation is weakened by the invention, and the influence of the heat conduction becomes relatively strong. Therefore, a configuration for reducing heat inflow to the suppressor electrode due to this heat conduction will be described as a modification.

FIG. 10 illustrates a cross-sectional view of a contact portion between the suppressor electrode 304 and the insulator 305 in a thermoelectric field emission electron source. In general, in order to align the axes of the suppressor electrode 304 and the electron source 301, the insulator 305 is formed into a cylindrical shape and is in surface contact with the cylindrical suppressor electrode 304. In the present modification, by providing gaps 1001 on the contact surface so as to reduce the contact area between the insulator 305 and the suppressor electrode 304, heat inflow due to heat conduction from the insulating 305 to the suppressor electrode 304 can be reduced. In addition, although the wider the gaps 1001, the more the heat inflow is reduced, it is desirable that the insulator 305 and the suppressor electrode 304 are in contact with each other at two points above and below the gaps 1001 so that the axes of the suppressor electrode 304 and the electron source 301 do not shift. In addition, in order to align the axes, the gaps 1001 are unnecessarily provided to be rotationally symmetrical to the insulator 305, and notches 1101 penetrating the upper and lower surfaces of the insulator 305 may be provided as shown in the plan view of FIG. 11.

The same machining may be performed on the suppressor electrode 304 instead of on the insulator 305. FIG. 12 illustrates a configuration corresponding to FIG. 10, and gaps 1001 are formed by machining the suppressor electrode 304. Similarly, FIG. 13 illustrates a configuration corresponding to FIG. 11, and is an example in which the suppressor electrode 304 is provided with notches 1101 that penetrate the contact surface up and down. In addition, the machining for reducing the contact area may be performed not only on one of the suppressor electrode 304 and the insulator 305, but on both the suppressor electrode 304 and the insulator 305. In this case, it is also necessary to adjust the machined portion so that the axes do not shift.

FIG. 14 illustrates a schematic configuration diagram of an electron beam application device equipped with the electron source described above. An electron optical system of the electron beam application device is built in a vacuum vessel 10, the electron optical system includes a thermoelectric field emission electron source 1, a focusing lens 3 that focuses an electron beam 2 emitted from the thermoelectric field emission electron source 1, a deflector 4 that deflects the electron beam 2 to scan a sample 7 placed on a stage 6, and an objective lens 5 that adjust a focal position of the electron beam 2 such that the electron beam 2 is focused on the sample 7. Each optical element constituting the electron optical system is controlled by control units 11 to 14 that control the respective optical elements, and a main control unit 15 controls each of the control units 11 to 14. For example, the main control unit 15 controls each of the control units 11 to 14 such that the sample 7 is irradiated with the electron beam 2 under a desired optical condition, and a signal electron emitted from the sample 7 is detected by a detector (not shown) to obtain an image.

In addition, the invention has been described with reference to a plurality of embodiments and modifications. The invention is not limited to the embodiments described above and includes various modifications. For example, the embodiments described above have been described for easy understanding of the invention, and the invention is not necessarily limited to those including all configurations described above. In addition, it is possible to replace a part of a configuration of one embodiment with the configuration of another embodiment, and it is also possible to add the configuration of another embodiment to the configuration of one embodiment. In addition, needless to say, it is also possible to implement a plurality of embodiments and modifications in combination.

REFERENCE SIGN LIST

1: thermoelectric field emission electron source, 2: electron beam, 3: focusing lens, 4: deflector, 5: objective lens, 6: stage, 7: sample, 10: vacuum vessel, 11: electron source control unit, 12: focusing lens control unit, 13: deflector control unit, 14: objective lens control unit, 15: main control unit, 301: electron source, 302: filament, 303: stem, 304: suppressor electrode, 304a: opening portion, 305: insulator, 306: extraction electrode, 306a: opening portion, 307: insulating body, 308: shielding member, 309: supporting member, 310, 410: refrigerant, 311, 411: heat transfer material, 501: power source, 502: feedthrough, 503: conductive component, 504: vacuum vessel (wall), 901: heater.

The invention claimed is:

1. A thermoelectric field emission electron source, comprising:
    an electron source having a needle shape;
    a metal wire to which the electron source is fixed and configured to heat the electron source;
    a stem fixed to an insulator and configured to energize the metal wire;
    a first electrode having a first opening portion and arranged such that a tip of the electron source protrudes from the first opening portion;
    a second electrode having a second opening portion;
    an insulating body configured to position the first electrode and the second electrode such that a central axis of the first opening portion and a central axis of the second opening portion coincide with each other, and provide electrical insulation between the first electrode and the second electrode; and
    a shielding member provided between the metal wire and the first electrode to shield light from the metal wire.

2. The thermoelectric field emission electron source according to claim 1, further comprising:
    a supporting member fixed to the insulator and supporting the shielding member, wherein
    the supporting member is in contact with a refrigerant via a heat transfer material.

3. A thermoelectric field emission electron source, comprising:
    an electron source having a needle shape;
    a metal wire to which the electron source is fixed and configured to heat the electron source;
    a stem fixed to an insulator and configured to energize the metal wire;
    a first electrode having a first opening portion and arranged such that a tip of the electron source protrudes from the first opening portion;
    a second electrode having a second opening portion; and
    an insulating body configured to position the first electrode and the second electrode such that a central axis of the first opening portion and a central axis of the second opening portion coincide with each other, and provide electrical insulation between the first electrode and the second electrode, wherein
    the insulating body is in contact with a refrigerant via a heat transfer material.

4. The thermoelectric field emission electron source according to claim 3, wherein
    a thermal conductivity of the insulating body is larger than 30 W/m·K.

5. The thermoelectric field emission electron source according to claim 3, wherein
    a part of the insulating body which serves as a path between the first electrode and the heat transfer material is formed of a metal having a thermal conductivity larger than 30 W/m·K.

6. A thermoelectric field emission electron source, comprising:
    an electron source having a needle shape;
    a metal wire to which the electron source is fixed and configured to heat the electron source;
    a stem fixed to an insulator and configured to energize the metal wire;
    a first electrode having a first opening portion and arranged such that a tip of the electron source protrudes from the first opening portion;
    a second electrode having a second opening portion; and
    an insulating body configured to position the first electrode and the second electrode such that a central axis of the first opening portion and a central axis of the second opening portion coincide with each other, and provide electrical insulation between the first electrode and the second electrode, wherein
    a surface of the first electrode facing the metal wire is coated with a material having a reflectance higher than that of a material for the first electrode, or is subjected to mirror-polishing.

7. A thermoelectric field emission electron source, comprising:
    an electron source having a needle shape;
    a metal wire to which the electron source is fixed and configured to heat the electron source;
    a stem fixed to an insulator and configured to energize the metal wire;
    a first electrode having a first opening portion and arranged such that a tip of the electron source protrudes from the first opening portion;
    a second electrode having a second opening portion; and
    an insulating body configured to position the first electrode and the second electrode such that a central axis of the first opening portion and a central axis of the second opening portion coincide with each other, and provide electrical insulation between the first electrode and the second electrode, wherein
    a surface of the first electrode is coated with an inert metal.

8. The thermoelectric field emission electron source according to claim 7, wherein
    the inert metal is gold or a transition metal nitride.

9. The thermoelectric field emission electron source according to claim 1, wherein
    a negative potential is applied to the first electrode with respect to the electron source, and a positive potential is applied to the second electrode with respect to the electron source.

10. The thermoelectric field emission electron source according to claim 9, wherein
    a gap is provided in a contact surface between the insulator and the first electrode.

11. The thermoelectric field emission electron source according to claim 10, wherein
    a machining for providing the gap is performed on the insulator or the first electrode.

12. An electron beam application device, comprising:
    a vacuum vessel;
    an electron optical system built in the vacuum vessel; and
    a power source provided outside the vacuum vessel, wherein the electron optical system includes the thermoelectric field emission electron source according to claim 1, a focusing lens configured to focus an electron beam emitted from the thermoelectric field emission electron source, a deflector configured to deflect the electron beam, and an objective lens configured to adjust a focal position of the electron beam, the power source applies a negative potential to the first electrode of the thermoelectric field emission electron source with respect to the electron source, and the power source is connected to the first electrode via a feedthrough and a conductive component provided in the vacuum vessel.

13. The electron beam application device according to claim 12, wherein the feedthrough and the conductive component have a thermal conductivity larger than 20 W/m·K.

14. The electron beam application device according to claim 13, wherein a connection path between the power source and the first electrode is in contact with a refrigerant provided outside the vacuum vessel.

15. The electron beam application device according to claim 12, wherein a heater is provided to be built in the vacuum vessel and is configured to heat the first electrode.

16. The thermoelectric field emission electron source according to claim 3, wherein a negative potential is applied to the first electrode with respect to the electron source, and a positive potential is applied to the second electrode with respect to the electron source.

17. The thermoelectric field emission electron source according to claim 6, wherein a negative potential is applied to the first electrode with respect to the electron source, and a positive potential is applied to the second electrode with respect to the electron source.

18. The thermoelectric field emission electron source according to claim 7, wherein a negative potential is applied to the first electrode with respect to the electron source, and a positive potential is applied to the second electrode with respect to the electron source.

19. An electron beam application device, comprising:

a vacuum vessel;

an electron optical system built in the vacuum vessel; and a power source provided outside the vacuum vessel, wherein the electron optical system includes the thermoelectric field emission electron source according to claim 3, a focusing lens configured to focus an electron beam emitted from the thermoelectric field emission electron source, a deflector configured to deflect the electron beam, and an objective lens configured to adjust a focal position of the electron beam, the power source applies a negative potential to the first electrode of the thermoelectric field emission electron source with respect to the electron source, and the power source is connected to the first electrode via a feedthrough and a conductive component provided in the vacuum vessel.

20. An electron beam application device, comprising:

a vacuum vessel;

an electron optical system built in the vacuum vessel; and a power source provided outside the vacuum vessel, wherein the electron optical system includes the thermoelectric field emission electron source according to claim 6, a focusing lens configured to focus an electron beam emitted from the thermoelectric field emission electron source, a deflector configured to deflect the electron beam, and an objective lens configured to adjust a focal position of the electron beam, the power source applies a negative potential to the first electrode of the thermoelectric field emission electron source with respect to the electron source, and the power source is connected to the first electrode via a feedthrough and a conductive component provided in the vacuum vessel.

21. An electron beam application device, comprising:

a vacuum vessel;

an electron optical system built in the vacuum vessel; and a power source provided outside the vacuum vessel, wherein the electron optical system includes the thermoelectric field emission electron source according to claim 7, a focusing lens configured to focus an electron beam emitted from the thermoelectric field emission electron source, a deflector configured to deflect the electron beam, and an objective lens configured to adjust a focal position of the electron beam, the power source applies a negative potential to the first electrode of the thermoelectric field emission electron source with respect to the electron source, and the power source is connected to the first electrode via a feedthrough and a conductive component provided in the vacuum vessel.

\* \* \* \* \*